United States Patent

Kalker

[11] Patent Number: 5,946,038
[45] Date of Patent: Aug. 31, 1999

[54] METHOD AND ARRANGEMENT FOR CODING AND DECODING SIGNALS

[75] Inventor: Antonius A. C. M. Kalker, Eindhoven, Netherlands

[73] Assignee: U.S. Philips Corporation, New York, N.Y.

[21] Appl. No.: 08/805,260

[22] Filed: Feb. 24, 1997

[30] Foreign Application Priority Data

Feb. 27, 1996 [EP] European Pat. Off. ............ 96200494

[51] Int. Cl.[6] ............................ H04N 7/12; H04N 11/02; H04N 11/04

[52] U.S. Cl. ......................... 348/397; 704/203; 704/204; 704/205; 348/403; 348/416

[58] Field of Search ........................... 348/395, 396, 348/397, 398, 399; 382/232, 233, 236, 238, 248, 249, 250, 268, 276; 358/426, 432, 433; 704/203, 204, 205; H04N 7/133, 7/130

[56] References Cited

U.S. PATENT DOCUMENTS

| | | |
|---|---|---|
| 5,227,990 | 7/1993 | Vaupel et al. .................. 364/724.01 |
| 5,297,236 | 3/1994 | Antill et al. ........................ 395/2.12 |
| 5,321,729 | 6/1994 | Schroder et al. ..................... 375/122 |
| 5,384,811 | 1/1995 | Dickopp et al. ..................... 375/122 |
| 5,500,685 | 3/1996 | Kokaram ............................ 348/620 |
| 5,661,814 | 8/1997 | Kalin et al. ........................ 381/68.2 |
| 5,727,119 | 3/1998 | Davidson et al. .................. 395/2.12 |

*Primary Examiner*—Bryan Tung
*Assistant Examiner*—Nhon T. Diep
*Attorney, Agent, or Firm*—Laurie E. Gathman

[57] ABSTRACT

A transform coder wherein different segments of signal samples to be transmitted to a receiver are encoded using different coding transforms. In order to avoid problems encountered with signal samples forming the transition between successive segments an intermediate transform is used for such transition. This has conventionally required significant transmission overhead, because the selected intermediate transform matrix must be transmitted to the receiver to enable it to decode the transitional signal samples. The invention instead provides weighting factors to indicate the extent to which frequency spectra of the basis functions of the intermediate transform resemble the frequency spectra of the basis functions of the transforms used for the adjoining signal segments. The inverse of the intermediate transform can then be calculated by the receiver from the weighting factors.

6 Claims, 5 Drawing Sheets

METHOD AND ARRANGEMENT FOR CODING AND DECODING SIGNALS

FIELD OF THE INVENTION

The invention relates to a method and arrangement for coding and decoding signals such as picture or sound signals by means of a lapped transform. More particularly, the invention relates to a method and system wherein different transforms are used for different segments of the picture or sound signal.

BACKGROUND OF THE INVENTION

By transforming a picture or sound signal, samples of the signal are transformed into coefficients. The coefficients are transmitted and subsequently backward-transformed to reconstruct the samples of the picture or sound signal. Both the forward transform at the transmitter end and the backward transform at the receiver end are defined by a transform matrix.

In a non-lapped transform such as the Discrete Cosine Transform (DCT) which is widely used in image coding, series of L samples are transformed into the same number of coefficients. From each series of coefficients, the corresponding series of samples can be reconstructed by a backward transform at the receiving end. The forward and backward transform matrices each have a dimension of L*L elements.

In a lapped transform, overlapping series of samples of the signal are transformed into a number of coefficients less than the number of samples. For example, a series of L samples partly overlapping each other are transformed into M coefficients. The transform matrix at the transmitter end and at the receiver end each have a dimension of M*L elements.

A signal transform may also be considered as a special case of filter bank coding. For example, the above-mentioned lapped transform may be implemented by a filter bank comprising M filters each having a filter length L. The filtered signals are decimated by a factor M which means that only each Mth sample of the filtered signals constitutes a coefficient which is transmitted while the intermediate M-1 samples are ignored. At the receiver end, the M coefficients are up-sampled (filling in the M-1 intermediate samples of with the value zero) and then applied to M interpolation filters each having a filter length L. The interpolated signals are subsequently summed in an adder.

By a transform, the input signal is decomposed into a weighted sum of basis functions, the coefficients constituting the weighting factors. The rows of the transform matrix or, equivalently, the impulse response functions of the interpolation filters of the filter bank constitute the basis functions. Each basis function has a frequency spectrum. Generally, the basis functions are chosen to be such that each basis function comprises a part of the total frequency spectrum.

Currently, segmentation based coding systems are envisaged in which different segments (e.g. subpictures of an image) are subjected to different transforms, for example in response to characteristics of a picture signal. One segment of the signal may be subjected to a first transform whereas a different second transform may be desired for a subsequent segment of the signal. A different transform is not only understood to mean a different transform matrix size but also a same matrix size with different element values. Switching from one transform to another does not cause any problem in a transmission system employing a non-lapped transform, because each series of samples can be reconstructed from the same number of coefficients, provided that the actual transform is known at the receiver end. However, problems do arise in transmission systems employing the lapped transform. Signal samples at the transition can not be reconstructed from the coefficients obtained by different transforms without complications. Similar problems arise at the boundary of signals having a finite extent, such as picture signals.

OBJECT AND SUMMARY OF THE INVENTION

It is an object of the invention to provide a method for encoding and decoding picture or sound signals in which the above mentioned problems are alleviated.

In accordance with the invention, the method of coding the signal is characterized by subjecting the signal samples forming the transition from the first to the second series of samples to an intermediate transform, said intermediate transform being determined by weighting factors indicating to what extent the frequency spectra of the basis functions of said intermediate transform resemble the frequency spectra of the first and second transform, and accommodating said weighting factors in the encoded signal.

The invention provides a solution for the following problem. It has turned out there are many candidate transform matrices for the transform of samples forming the transition from the first to the second series of signal samples. Not all the candidates are equally favourable with respect to smoothness of reconstruction, quality of frequency separation, energy preservation, etc. The intermediate transform eventually selected by the transmitter is therefore to be transmitted to the receiver and thus to be accommodated in the transmitted signal. The transmission of the selected intermediate transform matrix requires a significant overhead because the matrix comprises a plurality of floating point numbers, a small deviation in which may cause significant reconstruction errors. This problem is solved by using weighting factors to indicate to what extent the frequency spectra of the basis functions of the intermediate transform have to resemble the corresponding frequency spectra of the first and second transform. The weighting factors may be different for different basis functions. For example, a higher weight may be given to the DC coefficient (the transform coefficient associated with the first order basis function) than to lower order coefficients. The weighting factors are transmitted to a receiver. Using the transmitted weighting factors, the receiver can calculate the inverse intermediate transform.

DESCRIPTION OF PREFERRED EMBODIMENTS

Figure 1:
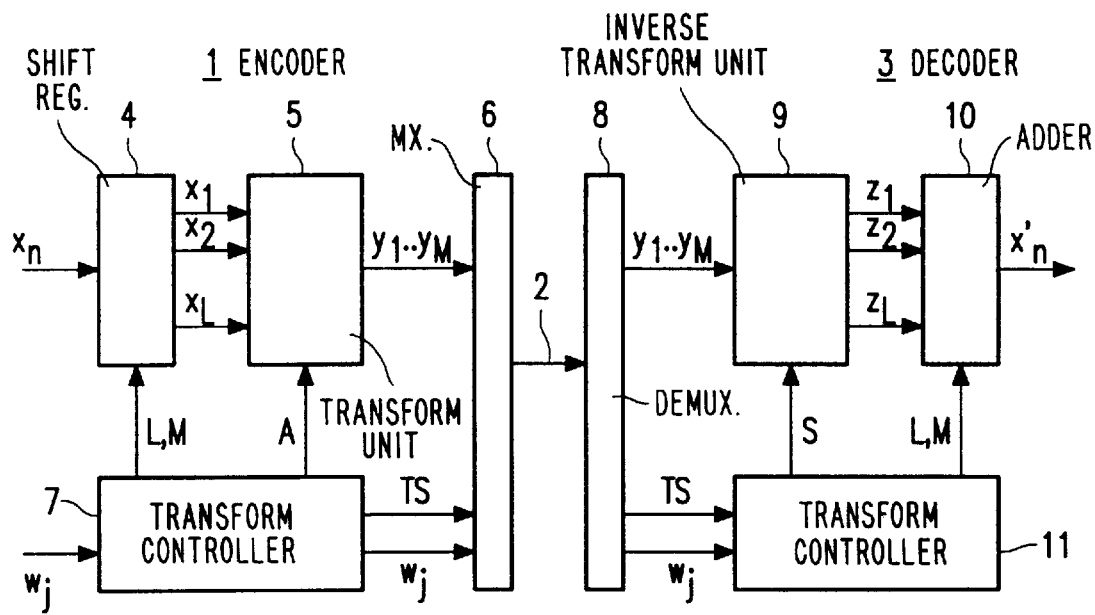
FIG. 1 shows a first embodiment of a system for transmitting picture or sound signals according to the invention.

FIG. 1 shows a first embodiment of a system for transmitting picture or sound signals according to the invention. The system comprises an encoding station 1, a transmission medium 2, and a decoding station 3. The transmission medium may be a radio or cable connection, but also a storage medium such as a magnetic tape or optical disc.

The transmitting station comprises a shift register 4 for series-to-parallel conversion of successive samples $x_n$ of an input signal. The shift register is programmable in the sense that the number L of samples and the number M of stages by which the input signal is shifted, is programmable. The L available samples are denoted $x_1 \ldots x_L$. They are applied to a transform unit 5 in which the vector $x_1 \ldots x_L$ is multiplied by an M*L transform matrix A. Each transform of L input samples yields M coefficients $y_1 \ldots y_M$. After quantization and encoding (not shown), they are applied to the transmission medium via a multiplexer 6.

In accordance with the invention, different transforms are applied to different segments of the input signal, for example, in response to local characteristics of the video image to be transmitted. To that end, the transmitting station further comprises a transform controller 7 which applies the actual transform matrix A to be used to transform unit 5. In practical compression systems, the transform matrix will be a selected one from a plurality of predetermined matrices. The controller applies a transform selection signal TS to the multiplexer 6 so as to inform the receiver which transform is used by the transmitter and, accordingly, which inverse transform is to be used at the receiving end. The controller also applies the programmable parameters L and M (i.e. the matrix dimensions), to the shift register 4.

In the receiving station decoder 3, a demultiplexer 8 applies the received coefficients $y_1 \ldots y_M$ to an inverse transform unit 9 which multiplies each series $y_1 \ldots y_M$ of M coefficients by an L*M matrix S. The transform of the M coefficients yields L intermediate sample values $z_1 \ldots z_L$. In an overlapped adding circuit 10, successive series of L sample values are added together in an overlapping manner to obtain reconstructed signal samples $x'_n$.

The receiving station further includes a transform controller 11 which receives, inter alia, the transform selection signal TS and selects, in response thereto, the transform matrix S to be used by inverse transform unit 9. The controller further applies the parameters L and M' associated with matrix S, to the adding circuit 10.

Figure 2:
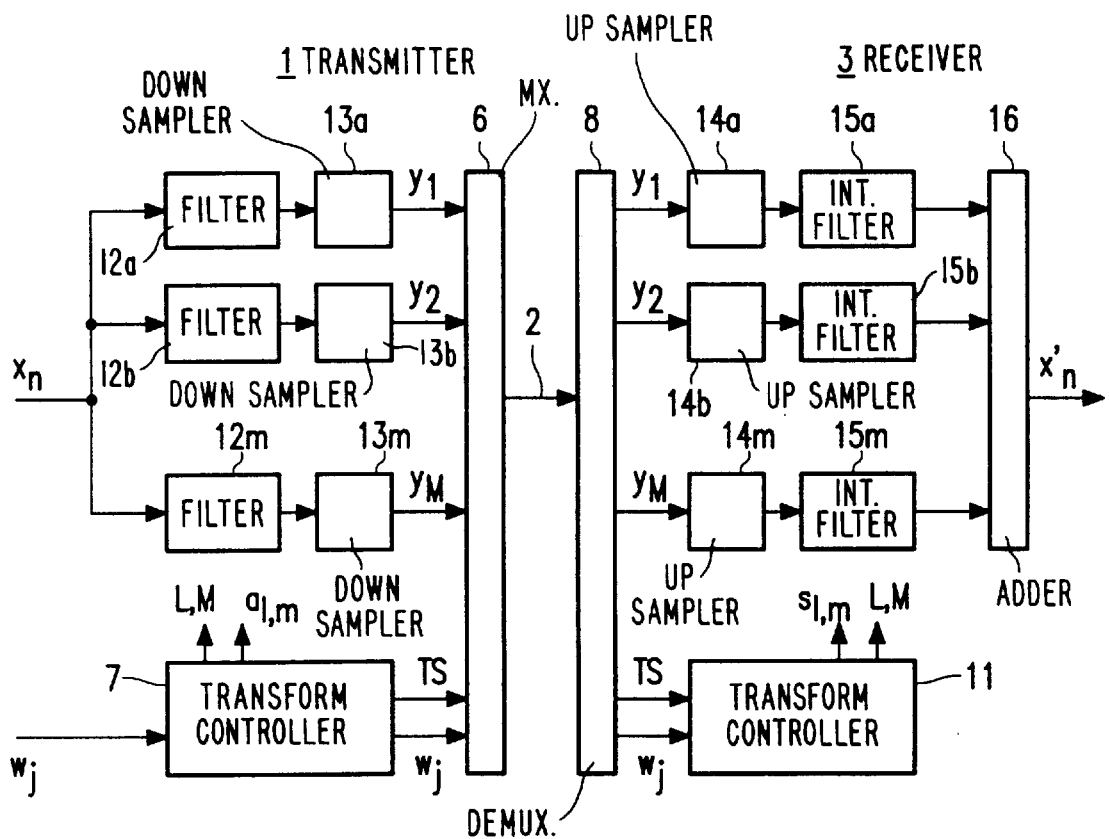
FIG. 2 shows a further embodiment of system for transmitting picture or sound signals according to the invention.

Nowadays it is realised that a signal transform may essentially be considered as a special case of multirate filter bank coding. Such a multirate filter bank is shown in FIG. 2 as a second embodiment of a system according to the invention. The filter bank of transmitting station 1 comprises M filters 12a ... 12m each having a filter length L and a transfer function $H_m(z)$. The filtered signals are decimated by a factor M in down-samplers 13a ... 13m. This is generally referred to as critical sampling. It means that only each Mth sample of the filtered signals is transmitted while the intermediate M-1 samples are ignored. Each transmitted sample represents a coefficients $y_m$ (m=1 ... M). After quantization and transmission (not shown), the coefficients are transmitted via the multiplexer 6.

The transmitting station further comprises the same transform controller 7 as shown in FIG. 1. The controller applies the actual filter coefficients $a_{l,m}$ (corresponding with the elements of matrix A in FIG. 1), the number of filters M, and the filter length L to be used, to the filters 12a ... 12m. The controller also applies the transform selection signal TS to the multiplexer 6 so as to inform the receiver which type of backward transform is to be used at the receiving end.

In the receiving station 3, the M signals are up-sampled (filling in the M-1 intermediate samples with the value zero) in up-samplers 14a ... 14m. Subsequently, they are applied to M interpolation filters 15a ... 15m having a filter length L and a transfer function $F_m(z)$. The interpolated signals are subsequently summed in an adder 16. Transform controller 11 applies the actual filter coefficients $s_{l,m}$ (corresponding with the elements of matrix S in FIG. 1), the number M of filters, and the filter length L to the filters 15a ... 15m.

The analogy between transform (FIG. 1) and multirate filter bank coding (FIG. 2) provides the possibility of gaining an insight into some aspects of the invention. For example, the M inpulse responses each having a length L of the interpolation filters $F_m(z)$ correspond to the M rows of the M*L transform matrix S, and the M impulse responses each having a length L of the filters $H_m(z)$ correspond to the rows of the matrix A which are reversed in order.

The features of the invention reside in the operation of transform controllers 7 and 11. To better understand these operations, signal transforms in general will be elucidated first. We will concentrate on one-dimensional transforms. Two-dimensional transforms (for example, of two-dimensional picture blocks) are generally separable, which means that they can be performed by performing a first one-dimensional transform in the horizontal direction and a second one-dimensional transform in the vertical direction.

The picture or sound signal to be transmitted comprises a finite number N of samples $x_n$. The forward transform at the transmitter end converts them into an equal number N of coefficients $y_n$. These coefficients are transmitted and backward-transformed at the receiver end. The forward and backward transforms are laid down in an N*N transform matrix.

In the practical systems shown in FIGS. 1 and 2, the sampled input signal $x_1 \ldots x_N$ is split up into successive series with which each have a relatively small number L of samples, each series being subjected to the same transform. Due to this division, the N*N transform matrix acquires a block-Toeplitz structure having relatively small matrices along the diagonal and zeroes elsewhere. In non-lapped transforms such as the generally known Discrete Cosine Transform (DCT) used for MPEG coding of picture signals, concatenated series of L samples are transformed into series of L coefficients by means of an L*L matrix. At the receiver end, each series of L samples can be reconstructed from the respective series of L coefficients. In lapped transforms, overlapping series of L samples are transformed into series of M (less than L) coefficients by means of an M*L matrix. After each transform, the input signal shifts by M samples. The M*L matrices overlap each other partly in the Toeplitz structure. To reconstruct a sample, the coefficients of all transforms which have been applied to series of samples comprising said sample are now to be taken into account. From each series of L coefficients, M samples can be reconstructed.

Figure 3:
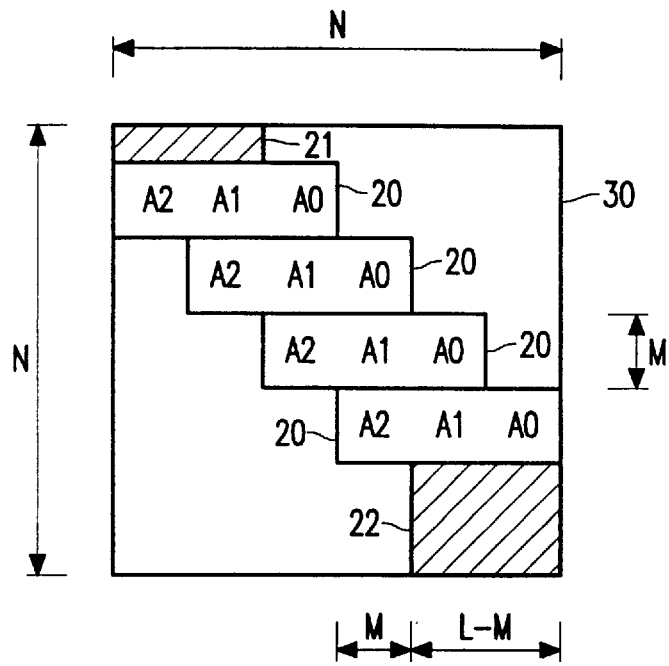
FIGS. 3–11 show diagrams to illustrate the operation of transform control circuits which are shown in FIGS. 1 and 2.

FIG. 3 shows an N*N transform matrix 30 for lapped transforming of N samples $x_n$, n=1 ... N). The matrix comprises a plurality of identical M*L matrices 20 along the diagonal, these matrices partly overlapping each other. The matrix 20 is referred to as stationary matrix. In the present example, the stationary matrix 20 in FIG. 3 will be assumed to have 2 rows (M=2) of 6 elements (L=6). As shown in the Figure, this matrix can be written in the form [A2 A1 A0].

In view of the similarity between a signal transform and multirate filter bank coding, the stationary M*L matrix may also be considered to represent a filter bank having M filters of length L. In accordance herewith, a matrix will also be referred to as filter bank or 'filters', for short.

In FIG. 3, a single stationary matrix 20 is used for transforming the input signal. Switching from a first stationary matrix to a different second matrix will be dealt with later. The transform of the finite length input signal $x_1 \ldots x_N$ may not start and end with the stationary filter 20. Otherwise, the transform matrix 30 is not invertible which means that the data samples at the boundaries cannot be reconstructed from the coefficients. Accordingly, so-called boundary filters 21 and 22 are to be used at the left and right boundary, respectively, of the input signal. An aspect of the invention relates to the problem of finding suitable boundary filters.

Boundary filters

In order to find suitable boundary filters, a first operation will be described in which boundary filters are computed which allow perfect or near perfect reconstruction of the data samples at the boundaries of the input signal. The filters thus found will appear to be not favourable with respect to coding efficiency (i.e. with respect to frequency separation) and hardware complexity. A second operation will be described in which these filters are converted into optimal boundary filters which are as similar as possible to the stationary filters.

Figure 4:
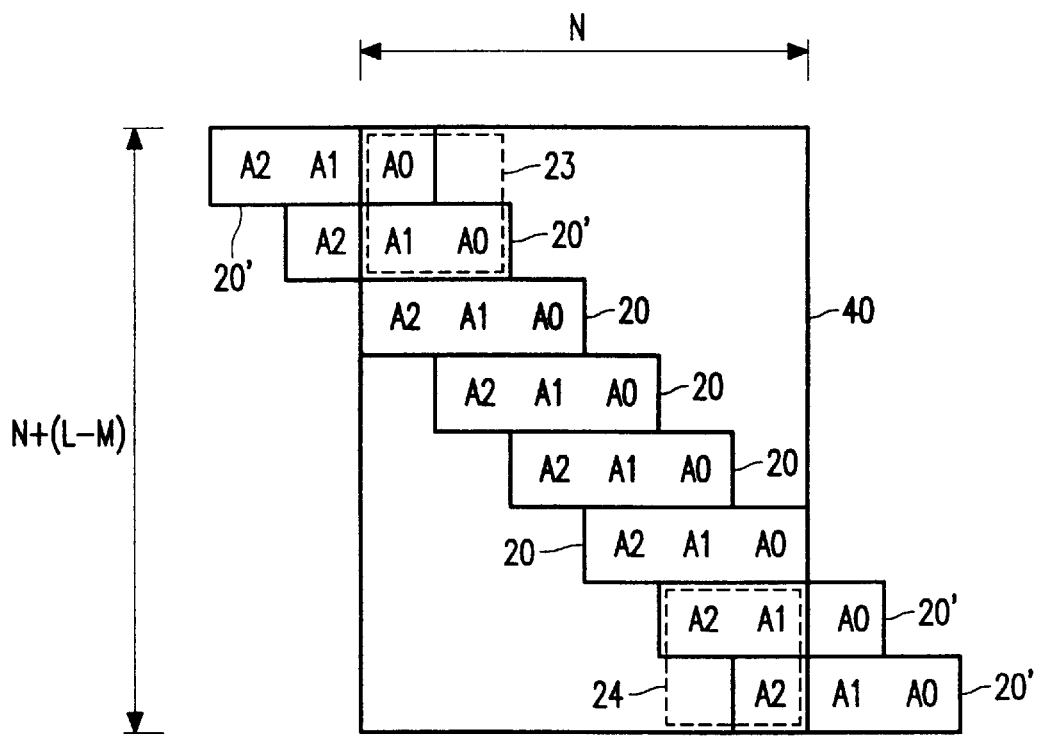

First, the finite input signal $x_1$ is assumed to be extended with zeroes at both ends and the stationary transform is applied to the extended signal as far as necessary. This is illustrated in FIG. 4 in which reference numerals 20' denote repetitions of stationary filter 20 along the diagonal. Said repetitions are carried out until they no longer affect the transform of the samples $x_1 \ldots x_N$.

Intuitively, it is expected that the left boundary filter will in some manner be related to the matrix which is denoted 23 in FIG. 4. Matrix 23 has the size L–M and can be written as:

$$\begin{bmatrix} A0 & 0 \\ A1 & A0 \end{bmatrix}$$

Similarly, the right boundary filter will be related to the matrix which is denoted 24 in FIG. 4. Matrix 24 also has the size L–M and can be written as:

$$\begin{bmatrix} A2 & A1 \\ 0 & A2 \end{bmatrix}$$

Matrices 23 and 24 themselves are not suitable to be boundary filters. This follows already from the fact that the transform matrix 40 shown in FIG. 4 has L–M more rows than columns, which means that transforming the N relevant samples $x_n$ will yield L–M more coefficients $y_n$ than necessary.

The first operation involves determining the rank $m_0$ (i.e. the number of independent rows) of matrix 23, and rotating (i.e. multiplying with an orthogonal rotating matrix R) said matrix to obtain $m_0$ non-zero rows. The non-zero part of the product matrix will be denoted B0. Hence:

$$[R] \times \begin{bmatrix} A0 & 0 \\ A1 & A0 \end{bmatrix} = \begin{bmatrix} 0 \\ B0 \end{bmatrix}$$

The same rotation R applied to matrix 24 yields a product matrix having $m_1$ non-zero rows. The non-zero part of said matrix will be denoted B1. Hence:

$$[R] \times \begin{bmatrix} A2 & A1 \\ 0 & A2 \end{bmatrix} = \begin{bmatrix} B1 \\ 0 \end{bmatrix}$$

The matrix R can be computed using the Procrustes algorithm as given in: Gene H. Golub and Charles F. van Loan: Matrix Computations; The John Hopkins University Press, Baltimore and London, 2nd edition, 1989.

The matrices B0 and B1 thus obtained can be used as boundary filter banks 21 and 22 (see FIG. 3). However, the above described operation does not give a unique solution, let alone that the filter banks are favourable in terms of frequency separation. Furthermore, the matrices B0 and B1 are not attractive from a hardware point of view, because the number of filters ($m_0$ and $m_1$, respectively) generally differs from the number of filters (M) in the stationary filter bank 20. In the present example where the stationary filter has two filters (M=2), the boundary filter banks B0 and B1 comprise one and three filters, respectively ($m_0=1$, $m_1=3$).

Figure 5:
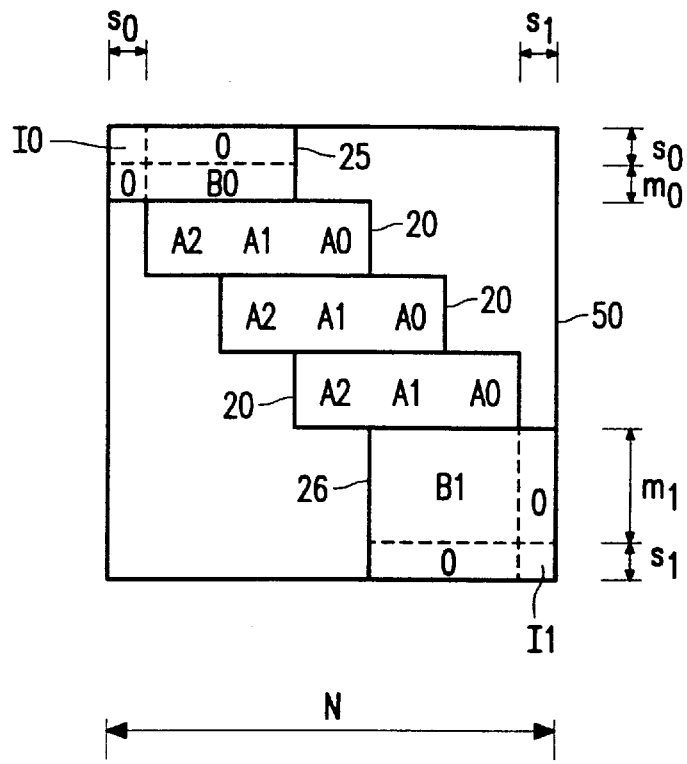

In view of a practical hardware implementation, the number of filters in each boundary filter bank is chosen to be an integer multiple of M. A single filter bank with programmable coefficients can then be used. To this end, an adequate number $s_0$ of orthogonal rows and columns are added to matrix B0, and an adequate number $s_1$ of orthogonal rows and columns are added to matrix B1. This is illustrated in FIG. 5 in which reference numerals 25 and 26 denote the matrices thus enlarged. They can be written as:

$$\begin{bmatrix} I0 & 0 \\ 0 & B0 \end{bmatrix} \text{ and } \begin{bmatrix} B1 & 0 \\ 0 & I1 \end{bmatrix}, \text{ respectively.} \quad \text{(Eq. 1)}$$

Herein, I0 is an identity matrix of size $s_0$ and I1 is an identity matrix of size $s_1$. In mathematics, the numbers $s_0$ and $s_1$ are referred to as padding factors. In the example of FIG. 5, the matrices 25 and 26 have M and 2M rows, respectively. They can be used as boundary filter banks but are still not favourable in terms of frequency separation.

Figure 6:
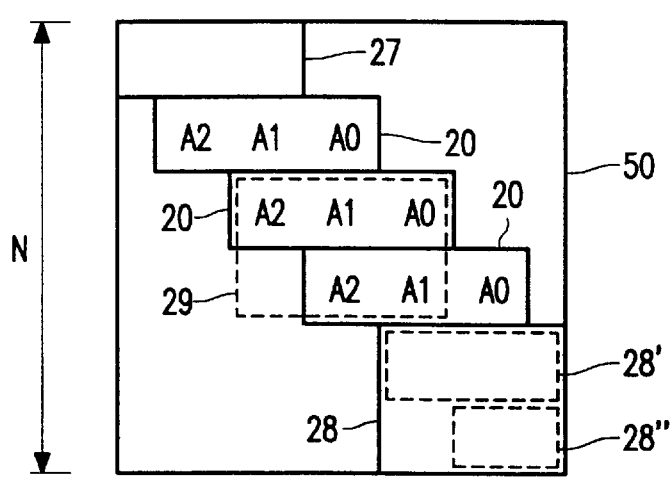

In the second operation, matrices 25 and 26 are rotated, by multiplication with respective rotation matrices R0 and R1, to obtain boundary filter banks which better fulfil the condition of adequate frequency separation. Said boundary filter banks are denoted 27 and 28 in FIG. 6. They can be written as $$[R0] \times \begin{bmatrix} I0 & 0 \\ 0 & B0 \end{bmatrix} \text{ and } [R1] \times \begin{bmatrix} B1 & 0 \\ 0 & I1 \end{bmatrix},$$

respectively.

The filters must exhibit a frequency separation behaviour as similar as possible with the stationary part of the transform matrix. In the present example, the two filters in the left boundary filter bank 27 must resemble the two filters in stationary filter bank 20 in terms of frequency spectrum. The four filters in the right boundary filter bank 28 must resemble the four filters in two successively operated stationary filter banks 20 (denoted 29 in FIG. 6).

The inventor has found that optimal rotation matrices R0 and R1 exist for a given weighted MSE (mean square error) in the frequency domain of the distance between the boundary filters and the stationary filter bank. The computation of R0 and R1 will now be described in more general terms. To that end, the above equations are generalised to represent a product matrix RB. Rotation matrix R is to be found such that the basis functions of RB optimally resemble (in terms of frequency spectrum) the basis functions of a given stationary matrix, say S, having the same number or rows. The computation of R involves many but straightforward arithmetic operations, which will now be described.

Stationary matrix S is Fourier transformed into a matrix C=SF (F denotes the Fourier transform) having elements $c_{ij}$ in the frequency domain. Similarly, boundary filter bank RB is Fourier transformed into a matrix D=RBF having elements $d_{ij}$ in the frequency domain. The length of boundary filter bank RB is hereby thought to be filled up with zeroes (extending a filter with zeroes causes the filter's frequency spectrum to be defined by more samples).

The weighted mean square error $MSE_i$ in the frequency domain of the distance between the spectrum of the i-th row of the boundary filter bank and the spectrum of the i-th row of the stationary filter bank is expressed as:

$$MSE_i = \sum_j w_j (c_{i,j} - d_{i,j})^2$$

in which $w_j$ is a weighting factor which is selected for each basis function and, as shown in FIGS. 1 and 2, transmitted to the receiver. $MSE_i$ is to be minimised for each basis function of the boundary filter bank, thereby keeping in mind that $c_{i,j}$ is known for a given stationary filter bank S whereas $d_{ij}$ defines the boundary filter bank RB being looked for. It is known that minimising $MSE_i$ corresponds with maximising the product term:

$$\sum_j w_j c_{i,j} d_{i,j}$$

Maximising the above product term is mathematically similar to maximising the sum over the diagonal of the matrix RBFWF*S* (* denotes transposition) in which W is a diagonal matrix having the weighting factors $w_j$ as diagonal, S represents the given stationary filter bank, B has already been calculated in the first operation (see Eq. 1), and F denotes the Fourier transform. Thus, the product matrix BFWF*S* is given.

Any matrix E can be written as a product E=UAV* in which U and V are energy preserving matrices and A is a diagonal matrix. In matrix computations this decomposition of matrix E is referred to as Singular Value Decomposition (SVD). Reference is made to Gene H. Golub and Charles F. van Loan: Matrix Computations, already mentioned hereinbefore. It is further known that the sum over the diagonal of RE=RUAV* is maximal for R=VU*. In accordance herewith, applying the SVD method to the matrix BFWF*S* yields matrices U and V and, consequently, the rotation matrix R=VU* for which the sum over the diagonal of RBFWF*S* is maximal.

The SVD method is applied to both boundaries of the input signal. In the present example, rotation matrix R0 (and thus boundary filter 27 in FIG. 6) is found by applying SVD to the matrix $$BFWF^*S^* = \begin{bmatrix} I0 & 0 \\ 0 & B0 \end{bmatrix} \times F \times W \times F^* \times [A2 \quad A1 \quad A0]^*$$

Similarly, rotation matrix R1 (and thus boundary filter 28 in FIG. 6) is found by applying SVD to the matrix $$BFWF^*S^* = \begin{bmatrix} B1 & 0 \\ 0 & I1 \end{bmatrix} \times F \times W \times F^* \times \begin{bmatrix} A2 & A1 & A0 \\ 0 & A2 & A1 \end{bmatrix}^*$$

In the present example, boundary filter bank 28 comprises 2M=4 filters. As expected in view of the similarity with matrix 29 shown in FIG. 6, the first coefficients of the 3rd and 4th filter will appear to be small. They may be replaced by zeroes, in which case the boundary filter bank 28 corresponds with two successively operated overlapped transforms 28' and 28". Both boundaries can now efficiently be processed by a single filter bank having M filters with L programmable filter coefficients.

Figures 7A, 7B, 7C:
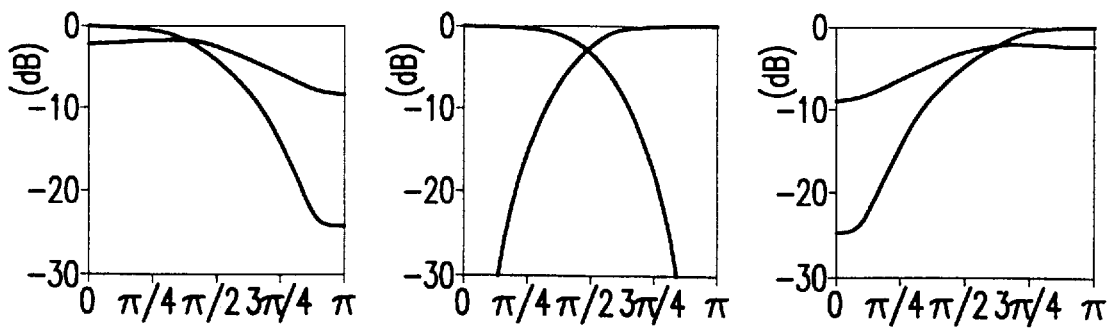

FIG. 7 shows the frequency responses of the left boundary filter bank (A), the stationary filter bank (B) and the right boundary filter bank (C) in the case that the stationary filter bank is a 2-channel Daubechies length 6 wavelet filter (M=2, L=6). The boundary filters are designed to match the frequency characteristics of the stationary filter with a very large weight for the DC coefficient. The Figure shows that the boundary filters are bad behaved in the sense that there is not a clear low pass and a clear high pass filter on both sides. The results illustrate that is not always possible to design excellent boundary filters.

Transition filters

Figure 8:
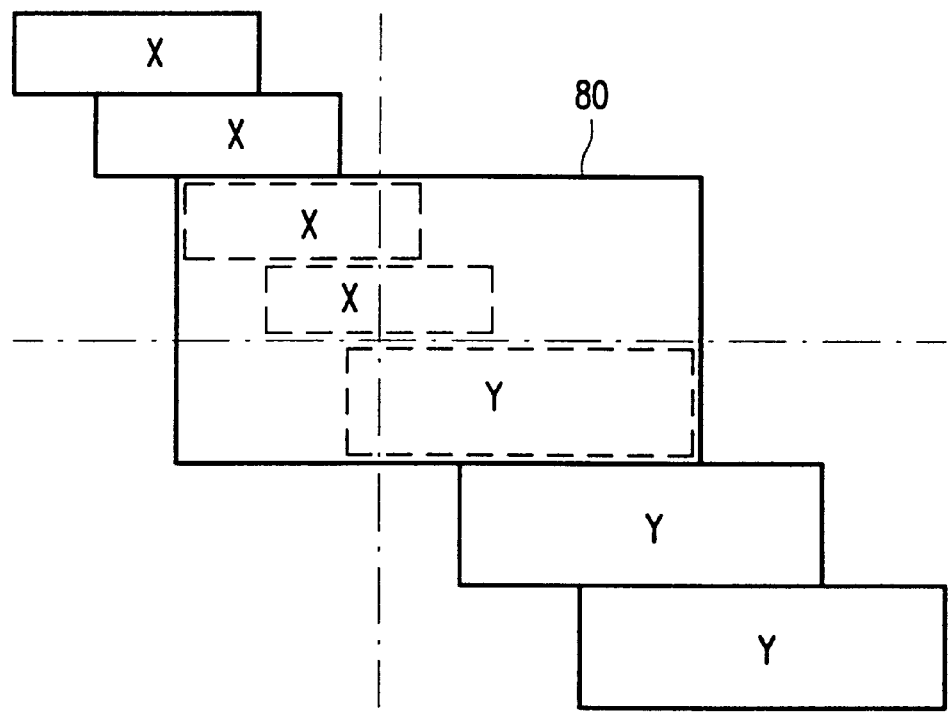

Currently, (image) coding systems are envisaged in which different segments of the input signal are subjected to different transforms, for example in response to local characteristics of a picture signal. One segment of the signal may be subjected to a first lapped transform whereas a second lapped transform is desired for a subsequent segment of the signal. FIG. 8 shows the relevant part of the Toeplitz transform matrix. In this Figure, X and Y denote the first and second stationary transform matrix, respectively. By way of example, X is assumed to be a 2*6 matrix whereas Y is a 3*9 matrix. It is important to realize that abruptly switching from filter bank X to filter bank Y (as shown by dotted lines in the Figure) constitutes a non-invertible transform. Accordingly, intermediate or transient filters (collectively denoted 80 in FIG. 8) are to be used.

A further aspect of the invention relates to the problem of finding suitable transition filters which allow a smooth transition from one stationary filter bank to another while preserving coding efficiency (good frequency separation).

Figure 9:
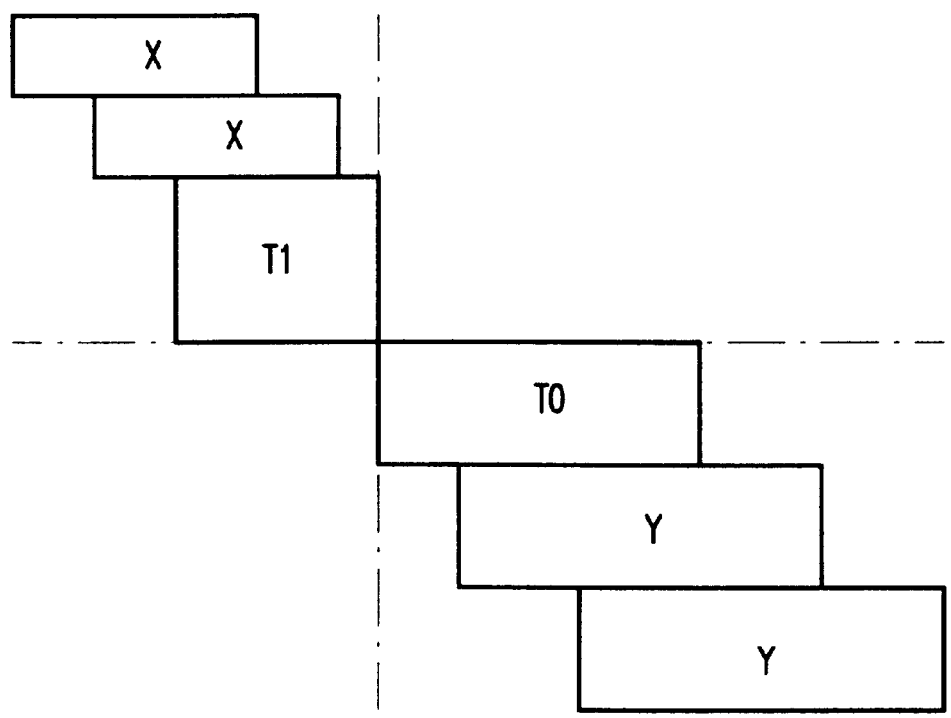

A possible strategy for switching from one stationary filter bank to another is using a right boundary filter to close the transform of a segment and using a left boundary filter to start the transform of the next segment. This strategy is illustrated in FIG. 9 wherein T1 denotes a right boundary filter relating to stationary transform X (cf. 28 in FIG. 6), and T0 denotes a left boundary filter relating to stationary transform Y (cf. 27 in FIG. 6).

Figure 10:
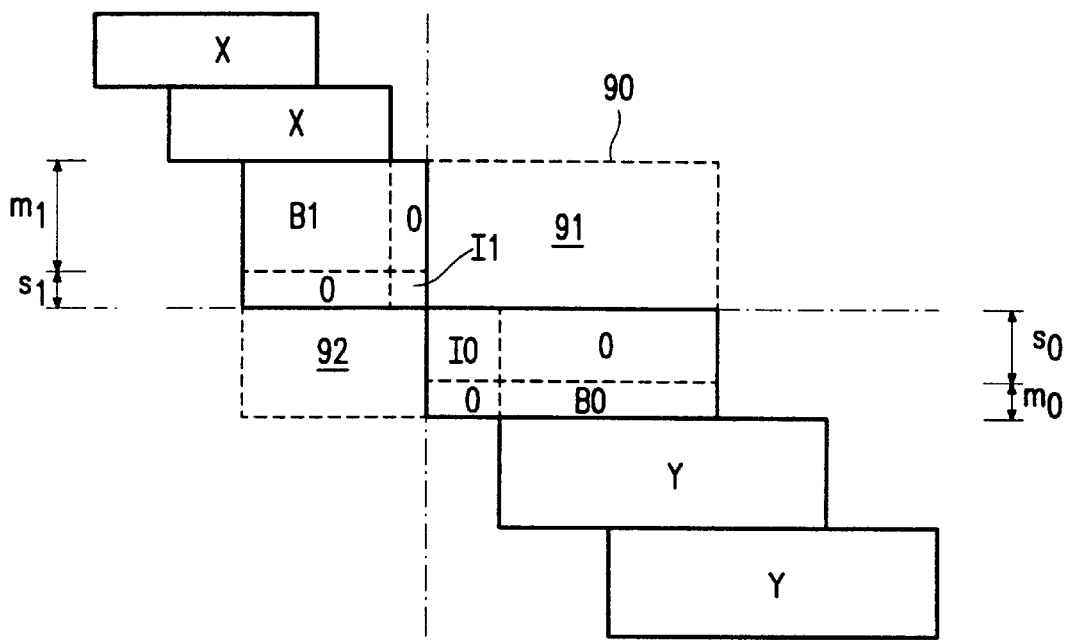
Figure 11A:
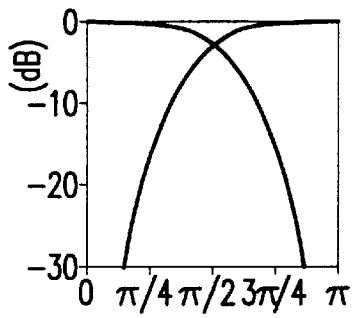
Figure 11B:
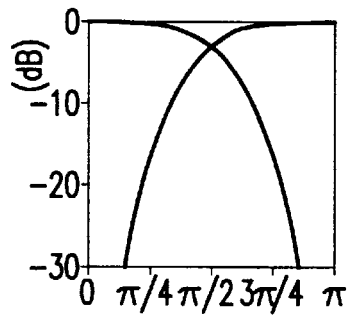
Figure 11C:
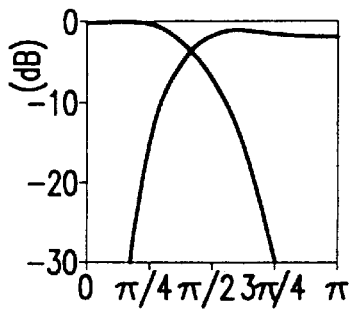
Figure 11D:
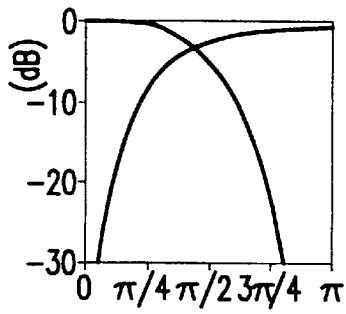
Figure 11E:
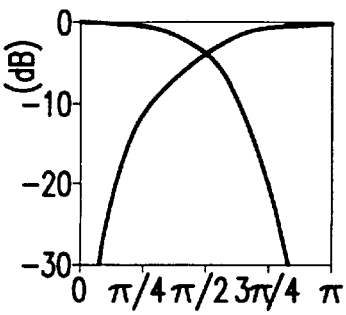

The above strategy is less attractive because, as already mentioned above., boundary filters are not always excellent in terms of coding efficiency. The design of a better behaving transition filter will now be described. The design comprises the same operations as described before with reference to the boundary filters. The first operation yields boundary filters $$\begin{bmatrix} B1 & 0 \\ 0 & I1 \end{bmatrix} \text{ and } \begin{bmatrix} I0 & 0 \\ 0 & B0 \end{bmatrix},$$

respectively, in accordance with Eq. 1. They are shown in FIG. 10. The second operation comprises rotation of said boundary filters to obtain optimal filters. However, whereas said rotation was previously applied to individual boundary matrices, the operation is now applied to a matrix B denoted 90 in FIG. 10, which covers both boundary filters. A significant advantage over the design of boundary filters is that rotation of matrix 90 may now create non-zeroes beyond the boundaries, i.e. within the matrix areas denoted 91 and 92 in FIG. 10. It is this degree of freedom which allows transient filters to behave considerably better than boundary filters.

Briefly summarizing the second operation, the transition matrix B denoted 90 in FIG. 10 is rotated by multiplication with an orthogonal matrix R. The rotation matrix R is to be found such that the product matrix RB exhibits a frequency separation behaviour as similar as possible with matrix 80 (see FIG. 8) which, in the present example, comprises two successively operated stationary filters X and one operation of stationary filter Y.

The rotating matrix R is calculated such that the weighted mean square error $MSE_i$ in the frequency domain of the distance between the spectrum of the i-th row of the transition filter and the spectrum of the i-th row of filter bank 80 is minimised for each basis function. The rotation matrix is calculated by applying the SVD method as already described before with reference to boundary filters. In accordance with the invention, the weighting factors used in the SVD calculation are transmitted to the decoder to allow said decoder to calculate the transition filter.

FIG. 1 shows the frequency responses of a first stationary filter bank (A), three successive operations (B, C, D) of a transition filter, and a second stationary filter bank (E). In this example, the first stationary filter bank (A) is a 2-channel Daubechies length 6 wavelet filter (M=2, L=6) and the second stationary filter bank (E) is a 2-channel Daubechies length 8 wavelet filter (M=2, L=8). The transitions filters are designed to match the frequency characteristics of the stationary filters with a very large weight for the DC coefficient. In contrast to FIG. 7, the transition filter banks have a clear low-pass and high-pass characteristic, and exhibit a gradual change from the first to the second stationary impulse responses.

I claim:

1. A method of transform coding a signal, comprising the steps of subjecting a first series of samples of the signal to a first lapped transform and a second series of samples of the signal to a second lapped transform, characterized by subjecting signal samples forming the transition from the first to the second series of samples to an intermediate transform, said intermediate transform being determined by weighting factors indicating to what extent the frequency spectra of the basis functions of said intermediate transform resemble the frequency spectra of the first and second transform, and accommodating said weighting factors in the encoded signal.

2. A method of decoding a transform coded signal of which a first series of samples has been subjected to a first lapped transform and a second series of samples has been subjected to a second lapped transform, characterized by applying an intermediate transform to decode signal samples forming the transition from the first to the second series of samples, said intermediate transform being determined by received weighting factors indicating to what extent the frequency spectra of the basis functions of the intermediate transform resemble the frequency spectra of the first and second transform.

3. An arrangement for transmitting a signal, comprising transform means for subjecting a first series of samples of the signal to a first lapped transform and a second series of samples of the signal to a second lapped transform, characterized by transform control means arranged to control the transform means to subject signal samples forming the transition from the first to the second series of samples to an intermediate transform, said intermediate transform being defined by weighting factors indicating to what extent the frequency spectra of the basis functions of said intermediate transform have to resemble the frequency spectra of the first and second transform, and to transmit said weighting factors to a receiver.

4. An arrangement for decoding a transform coded signal of which a first series of samples has been subjected to a first lapped transform and a second series of samples has been subjected to a second lapped transform, comprising transform means for transforming the encoded signal into signal samples, characterized by transform control means arranged to control the transform means to apply an intermediate transform to obtain signal samples forming the transition from the first to the second series of samples, said intermediate transform being defined by received weighting factors indicating to what extent the frequency spectra of the basis functions of the intermediate transform resemble the frequency spectra of the first and second transform.

5. An encoded signal, comprising first transform coefficients representing a first series of samples of said signal in accordance with a first transform and second transform coefficients representing a second series of samples of said signal in accordance with a second transform, characterized in that the encoded signal comprises intermediate transform coefficients representing signal samples forming the transition from the first to the second series in accordance with an intermediate transform, and weighting factors indicating to what extent the frequency spectra of the basis functions of said intermediate transform resemble the frequency spectra of said first and second transform.

6. A storage medium on which an encoded signal as claimed in claim 5 has been stored.

\* \* \* \* \*